United States Patent
Tsai et al.

(10) Patent No.: US 9,252,064 B2
(45) Date of Patent: Feb. 2, 2016

(54) FINGERPRINT MODULE AND MANUFACTURING METHOD FOR SAME

(71) Applicants: DYNACARD CO., LTD., Taoyuan County (TW); EGIS TECHNOLOGY INC., Taipei (TW)

(72) Inventors: Pai Ching Tsai, Taoyuan County (TW); Nian-Horng Hwang, Taipei (TW)

(73) Assignees: DYNACARD CO., LTD., Taoyuan County (TW); EGIS TECHNOLOGY INC., Taipei (TW)

( * ) Notice: Subject to any disclaimer, the term of this patent is extended or adjusted under 35 U.S.C. 154(b) by 12 days.

(21) Appl. No.: 14/279,279

(22) Filed: May 15, 2014

(65) Prior Publication Data

US 2015/0243571 A1 Aug. 27, 2015

(30) Foreign Application Priority Data

Feb. 24, 2014 (TW) ............... 103106027 A

(51) Int. Cl.
*H01L 21/44* (2006.01)
*H01L 21/48* (2006.01)
*H01L 21/50* (2006.01)
*H01L 23/04* (2006.01)
(Continued)

(52) U.S. Cl.
CPC .......... *H01L 23/041* (2013.01); *G06K 9/00006* (2013.01); *H01L 21/52* (2013.01); *H01L 21/563* (2013.01); *H01L 23/3114* (2013.01); *H01L 24/97* (2013.01); *H01L 2224/48091* (2013.01); *H01L 2224/48227* (2013.01)

(58) Field of Classification Search
CPC ..... H01L 21/56; H01L 21/565; H01L 21/304; H01L 21/31641; H01L 21/02178; H01L 23/488; H01L 23/4951; H01L 23/3114; H01L 23/3157; H01L 29/7869; H01L 27/146; H01L 27/14667
USPC ............. 438/106, 70, 75, 104, 124, 127, 141, 438/509, 584, 608, 617, 782; 257/233, 292, 257/678, E21.006, E21.053, E21.077, 257/E21.091, E21.126, E21.127, E21.185, 257/E21.253, E21.352, E21.499, E21.502, 257/E21.503, E21.504, E21.617

See application file for complete search history.

(56) References Cited

U.S. PATENT DOCUMENTS 7,777,351 B1 * 8/2010 Berry et al. .................. 257/778
7,880,282 B2 * 2/2011 Holland ........................ 257/678

(Continued)

FOREIGN PATENT DOCUMENTS

| JP | 11-512962 A | 11/1999 |
|----|----|----|
| JP | 2000-196026 A | 7/2000 |

(Continued)

*Primary Examiner* — David Nhu
(74) *Attorney, Agent, or Firm* — Li & Cai Intellectual Property (USA) Office

(57) ABSTRACT

A fingerprint module of fingerprint identification chip is provided. The fingerprint module includes a substrate, a fingerprint identification chip, a molding layer, a color layer, and a protecting layer. The substrate includes a pair of surfaces and a plurality of pads. The surfaces are on the opposite sides of the substrate. The pads are exposed on one of the surfaces. The fingerprint identification chip electrically connects with the substrate according to at least a wire. The molding layer disposes on the substrate and covers the fingerprint identification chip and the wire. The color layer disposes on the molding layer. The protecting layer disposes on the color layer.

12 Claims, 6 Drawing Sheets

(51) Int. Cl.
*H01L 23/31* (2006.01)
*H01L 21/56* (2006.01)
*H01L 21/52* (2006.01)
*G06K 9/00* (2006.01)
*H01L 23/00* (2006.01)

(56) References Cited

U.S. PATENT DOCUMENTS

| | | | |
|---|---|---|---|
| 8,717,775 B1 * | 5/2014 | Bolognia et al. | 361/803 |
| 2006/0005696 A1 | 1/2006 | Glisenti | |
| 2009/0051027 A1 * | 2/2009 | Lin | 257/734 |

FOREIGN PATENT DOCUMENTS

| | | |
|---|---|---|
| JP | 2003-083708 | 3/2003 |
| JP | 2003-188165 A | 7/2003 |
| JP | 2006-229056 A | 8/2006 |
| JP | 2008-300656 A | 12/2008 |
| JP | 2010-130025 A | 6/2010 |
| JP | 2011-175505 A | 9/2011 |
| KR | 10-1301063 | 8/2013 |
| KR | 10-1368264 | 2/2014 |
| WO | WO 98/03934 A2 | 1/1998 |
| WO | WO2013/172604 A1 | 11/2013 |
| WO | WO2014/015840 A1 | 1/2014 |

* cited by examiner

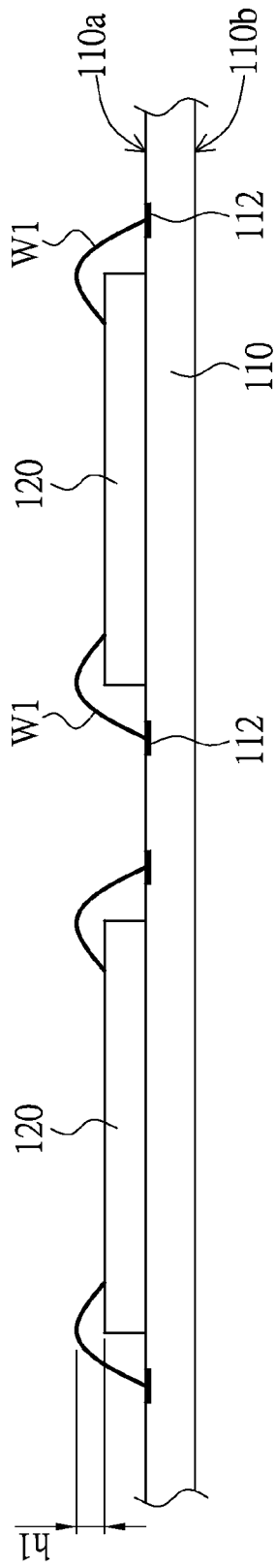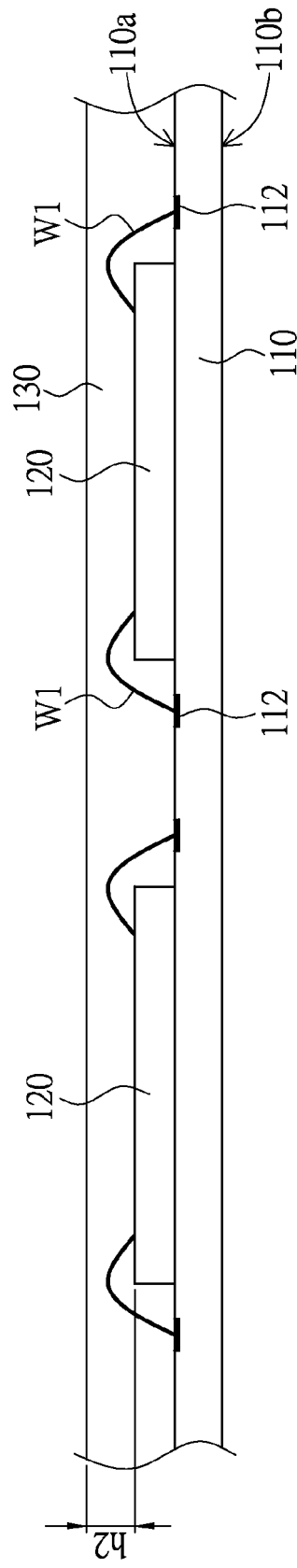
FIG.1A
FIG.1B

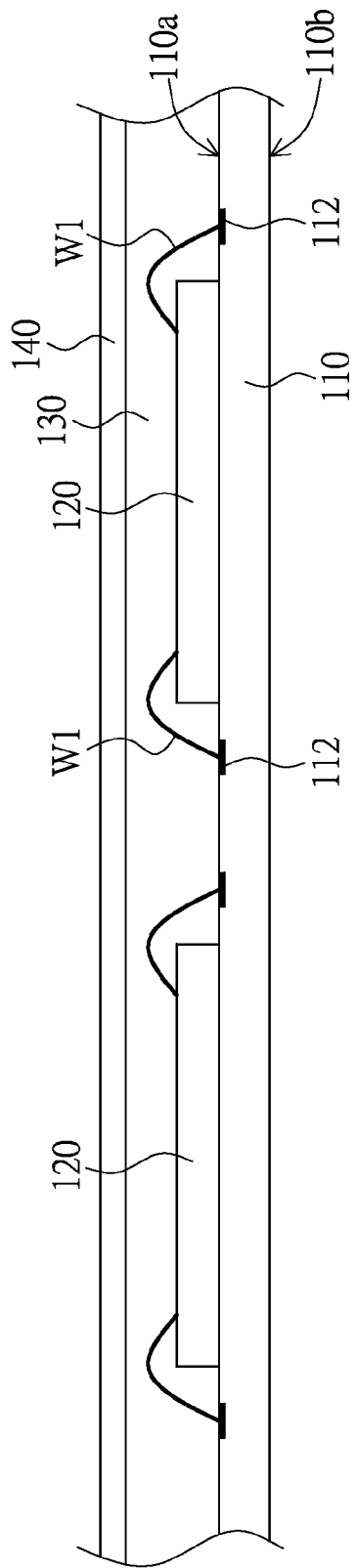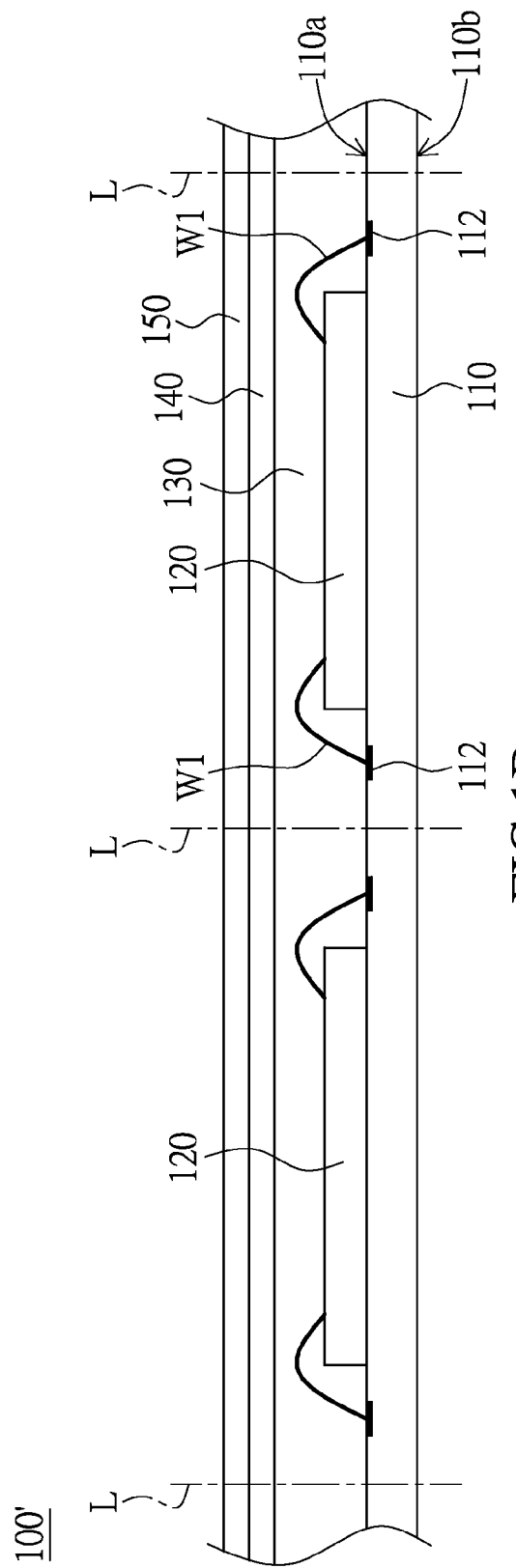

FINGERPRINT MODULE AND MANUFACTURING METHOD FOR SAME

BACKGROUND

1. Technical Field

The present invention relates to a fingerprint module having the chip and the manufacturing method of the same, and in particular to a fingerprint module having a fingerprint identification chip and the manufacturing method of the same.

2. Description of Related Art

The traditional fingerprint module includes a substrate, a chip, and a molding layer. The chip is disposed on the substrate and electrically connected to the substrate. The molding layer covers the surface of the substrate and partial chip, so as to immobilize the chip and protect the wire. In addition, the sensing area of the chip is exposed on the molding layer.

In general, while the user touches the sensing area of the chip, the chip would sustain the force applied by the finger. Thus, the chip might have cracks caused by the repeated stress. In addition, the chip is exposed on the air and touched by the finger directly. Thus, the chip might identify the fingerprint incorrectly according to the oil contamination from the finger touching or the powdery dirt from the external environment.

SUMMARY

The present invention provides a fingerprint module. The fingerprint identification chip of the fingerprint module can be protected.

The present invention provides a manufacturing method of the abovementioned fingerprint module.

The present invention provides a fingerprint module. The fingerprint module includes a substrate, a fingerprint identification chip, a molding layer, a color layer, and a protecting layer. The substrate includes a pair of surfaces and a plurality of pads. The surfaces are formed on two different sides of the substrate. The pads are exposed on one of the surface. The fingerprint identification chip is electrically connected to the substrate by a wire. The molding layer is disposed on the substrate and covers the fingerprint identification chip and the wire. The color layer is disposed on the molding layer. The protecting layer is disposed on the color layer.

The present invention provides a manufacturing method of the fingerprint module. Firstly, a substrate is provided. The substrate includes a pair of surfaces and a plurality of pads. The surfaces are formed on two different sides of the substrate. The pads exposed on one of the surface. Then, a fingerprint identification chip is disposed on the substrate. Next, the substrate is electrically connected to the fingerprint identification chip by reverse wire bonding. After reverse wire bonding, a molding layer is disposed on the substrate. The molding layer covers the fingerprint identification chip and the wire. After forming the molding layer, a color layer is disposed on the molding layer. After forming a color layer, a protecting layer is disposed on the color layer.

To sum up, the embodiment of the present invention provides the fingerprint module and the manufacturing method for the same. The fingerprint module includes the substrate, the fingerprint identification chip, the molding layer, the color layer, and the protecting layer. The molding layer, the color layer, and the protecting layer cover the fingerprint identification chip. In addition, in the manufacturing method of the embodiment in the present invention, the reverse wire bonding can electrically connect the fingerprint identification chip and the substrate, so as to reduce the height of the wire and the molding layer in need. While touching the protecting layer of the fingerprint module, the fingerprint identification chip can identify the fingerprint of the user. Moreover, the fingerprint identification chip can be protected.

In order to further appreciate the characteristic and technical contents of the present invention, references are hereunder made to the detailed descriptions and appended drawings in connection with the present invention. However, the appended drawings are merely shown for exemplary purpose rather than being used to restrict the scope of the present invention.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

FIG. 1A to 1E are the cross-section views of a manufacturing method for the fingerprint module in accordance with a first embodiment of the instant disclosure.

DESCRIPTION OF THE EXEMPLARY EMBODIMENTS

Figure 1E:
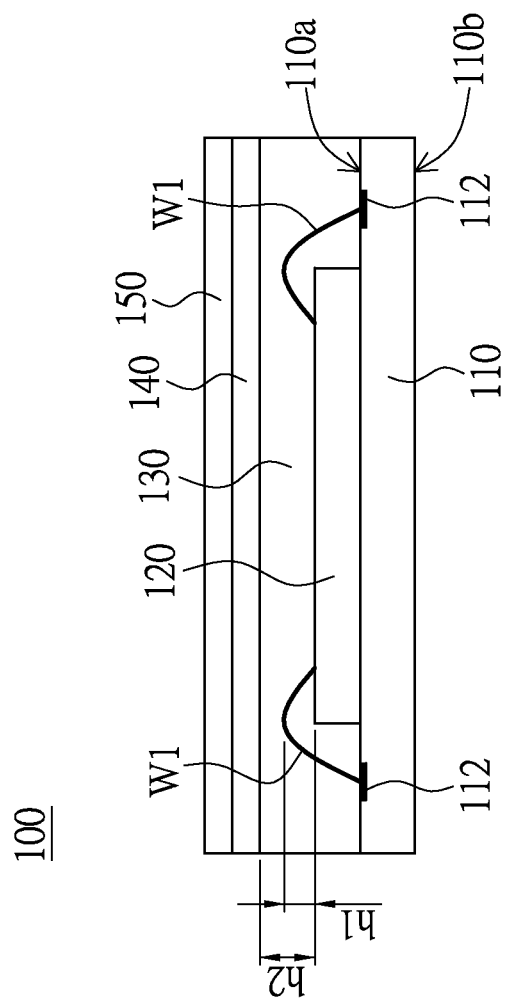

FIG. 1A to 1E are the cross-section views of a manufacturing method for the fingerprint module 100 in accordance with a first embodiment of the instant disclosure. FIG. 1E is the cross-section of the fingerprint module 100. Referring to FIG. 1E, the fingerprint module 100 includes a substrate 110, a fingerprint identification chip 120, a molding layer 130, a color layer 140, and a protecting layer 150.

The substrate 110 is a disposed carrier of the fingerprint identification chip 120. The substrate 110 includes a pair of surfaces 110a, 110b, and a plurality of pads 112. The surfaces 110a and 110b are formed on two different sides of the substrate 110. The pads 112 are exposed on the surface 110a. It worth noting that, the substrate 110 can be the printed circuit board (PCB) or the flexible printed circuit board (FPCB) and the pads 112 can be disposed on the substrate 110 according to the demand of the fingerprint identification chip 120. In addition, in the present embodiment, the substrate 110 can be the rectangular plate. However, the present invention is not limited thereto. In other embodiment, the substrate 110 can be circular plate, elliptical-shaped plate, square plat, or triangular plate. The shape of the substrate 110 can be adjusted according to the reality demand.

The fingerprint identification chip 120 is electrically connected to the pads 112 on the substrate 110 by reversely bonding the wires W1. However, in other embodiment, the fingerprint identification chip can be electrically connected to the substrate by flipping the chip or other packaging method, the present invention is not limited thereto. The shortest distance h1 from the apex of the wires W1 related to the surface 110a to the top surface of the fingerprint identification chip 120. The distance h1 is the vertical distance and in the range of 20 to 30 µm.

In addition, the molding layer 130 is disposed on the surface 110a and covers the fingerprint identification chip 120 and the wires W1 on the surface 110a. In the present embodiment, the material of the molding layer 130 is aluminum oxide. The shortest distance h2 form the surface of the molding layer 130 to the fingerprint identification chip 120. The distance h2 is the vertical distance and in the range of 25 to 50 µm. The whole fingerprint identification chip 120 is embedded inside the molding layer 130, so that the molding layer 130 can protect the fingerprint identification chip 120.

Referring to FIG. 1E, the fingerprint module further includes a color layer 140 and a protecting layer 150. The color layer 140 is disposed on the molding layer 130. The protecting layer 150 is disposed on the color layer 140. Specifically, in the present embodiment, the material of the color layer 140 can be the combination of aluminum oxide and the nonmetal. For example, the colored nonmetallic layer is disposed on the molding layer 130 made of aluminum oxide. The nonmetallic material can include silicon or graphic. The nonmetallic material can make the surface of the molding layer appear the color, such as white, gold, purple, orange, green, red, or black, so as to form the color layer 140. In other words, the color layer 140 can provide the color of the fingerprint module 100. Moreover, the color of the color layer 140 can be adjusted according to the reality demand. The present invention is not limited thereto.

In the present embodiment, the material of the protecting layer 150 includes aluminum oxide and the protecting layer 150 is transparent. The protecting layer 150 is utilized to protect the color layer 140. In reality, the protecting layer 150 can reduce the chance that the user destroys the surface of the color layer 140 according to the improper use, such as scraping or grinding. Moreover, since the protecting layer 150 is transparent, the color of the color layer 140 beneath the protecting layer 150 can be appeared.

The following description introduces the manufacturing method of the fingerprint module 100. FIG. 1A to 1E are the cross-section views of a manufacturing method for the fingerprint module 100 in accordance with a first embodiment of the instant disclosure. Referring to FIG. 1A, firstly, the substrate 110 is provided. The substrate 110 includes a pair of surfaces 110a, 110b, and the plural pads 112. The surfaces 110a and 110b are formed on two different sides of the substrate 110. The pads 112 are exposed on the surface 110a.

Next, plural fingerprint identification chips 120 are disposed on the substrate 110. Specifically, each of the fingerprint identification chips 120 is disposed on the surface 110a and electrically connected to the one of the pads 112 by bonding the wires W1. The shortest distance h1 from the apex of the wires W1 related to the surface 110a to the top surface of the fingerprint identification chip 120. The distance h1 is the vertical distance and in the range of 20 to 30 µm.

It worth noting that, in the present embodiment, the wires W1 electrically connect the fingerprint identification chip 120 and one of the pads 112 by the method of reverse wire bonding. More specifically, one end of the wires W1 connects to one of the pads 112 on the substrate 110 firstly. Then, the other end of the wires W1 is pulled up to the top of the fingerprint identification chip 120. Contrast to the traditional wire bonding, reverse wire bonding can reduce the height of the wires W1. In other words, the distance h1 between the apex of the wires W1 related to the surface 110a to the top surface of the fingerprint identification chip 120 is lower than the traditional wire bonding.

Referring to FIG. 1B, the molding layer 130 is formed on the substrate 110. The molding layer 130 covers the fingerprint identification chip 120 and the pads 112. In the present embodiment, the molding layer 130 is formed by the method of high pressuring injection molding. However, the present invention is not limited thereto. In addition, in the present embodiment, the material of the molding layer 130 includes aluminum oxide. The particle size of the material of the molding layer 130 is in the range of 65 to 75 µm. At this process, the shortest distance from the top surface of the molding layer 130 to the fingerprint identification chip 120 is in the range of 100 to 150 µm.

After the molding layer 130 is formed, the molding layer 130 is grinded. In the present embodiment, the molding layer 130 can be grinded by mechanical grinding. However, the present embodiment doesn't limit the grinding method. After grinding, the shortest distance h2 from the top surface of the molding layer 130 to the fingerprint identification chip 120 is in the range of 25 to 50 µm. It worth noting that, the particle size of the material utilizing in the molding layer 130 is in the range of 65 to 75 µm generally. However, in the present invention, the shortest distance h2 from the top surface of the molding layer 130 to the fingerprint identification chip 120 is designed to be in the range of 25 to 50 µm. In other words, the particle size of the material utilizing in the molding layer 130 is greater than the designed distance h2 from the molding layer 130 to the fingerprint identification chip 120. Hence, the molding layer 130 needs to be grinded after it formed, so as to make the distance h2 in the range of 25 to 50 µm.

Referring to FIG. 1C, a color layer 140 is formed on the molding layer 130. The color layer 140 attaches to the surface of the molding layer 130. In the present embodiment, the color layer 140 is forming on the surface of the molding layer 130 by sputtering. After sputtering, the color layer 140 can make the surface of the molding layer made of aluminum oxide appear different color. In addition, the thickness of the color layer 140 is in the range of 0.1 to 1.5 µm. In other embodiment, the color layer can be made by electroplating, evaporation, or vacuum sputtering. The present invention is not limited thereto. Moreover, in other embodiment, the fingerprint module might be without the color layer, if there is no demand for a special color.

Next, referring to FIG. 1D, a protecting layer 150 is formed on the color layer 140, so as to form a package interconnection plate of the fingerprint identification chip 100'. The protecting layer 150 can be formed on the color layer 140 by coating, printing, or sputtering. The material of the protecting layer 150 is hydrophobic and oleophobic. In addition, the protecting layer 150 is transparent. The thickness of the protecting layer 150 is in the range of 0.1 to 1.5 µm.

In reality, the protecting layer 150 is transparent, thus the color of the color layer 140 beneath the protecting layer 150 can be appeared. Furthermore, the material of the protecting layer 150 is hydrophobic and oleophobic, so that the protecting layer 150 can protect the fingerprint module 100. While the user touches the fingerprint identification chip 100, the protecting layer 150 can reduce the chance that the identification of the fingerprint identification chip 120 is in error according to the oil contamination or water from the finger touching and the powdery dirt or stem from the external environment.

Referring to FIGS. 1D and 1E, then the package interconnection plate of the fingerprint identification chip 100' is cut into several fingerprint modules 100. Specifically, the package interconnection plate of the fingerprint identification chip 100' includes plural cutting lines L. The cutting lines L can be designed according to the reality demand. For example, in the present embodiment, the cutting lines L divide the package interconnection plate of the fingerprint identification chip 100' into plural rectangular structures. However, the present invention is not limited thereto. In other embodiment, the cutting lines L can divide the package interconnection plate of the fingerprint identification chip 100' into other shape of structure, such as circular structure, elliptical-shaped structure, square structure, or triangular structure.

It worth noting that, the package interconnection plate of the fingerprint identification chip 100' can be cut to from the fingerprint module 100 by stamping or mechanical cutting. The shape of the fingerprint module 100 is designed according to the cutting lines L. In the present embodiment, the cutting lines L divide the package interconnection plate of the fingerprint identification chip 100' into plural rectangular structures. After cutting, the package interconnection plate of the fingerprint identification chip 100' is divided into plural rectangular fingerprint modules 100. However, in other embodiment, the shape of the fingerprint module 100 can be circle, elliptical, square, or triangle according to the reality demand. The present invention is not limited thereto. Moreover, in the present embodiment, the shortest distance h2 form the surface of the molding layer 130 to the fingerprint identification chip 120 is in the range of 25 to 50 μm, the thickness of the color layer 140 is in the range of 0.1 to 1.5 μm, and the thickness of the protecting layer 150 is in the range of 0.1 to 1.5 μm. Furthermore, the dielectric constants of the molding layer 130, the color layer 140, and the protecting layer 150 are in the range of 15 to 45. In other words, the height from the top of the protecting layer 150 to the fingerprint identification chip 120 is only several tens of microns, and the dielectric constants of the materials of the molding layer 130, the color layer 140, and the protecting layer 150 are high. Thus, identification function of the fingerprint identification chip 120 would not be affected by the molding layer 130, the color layer 140, and the protecting layer 150. While the user touches the surface of the protecting layer 150, the fingerprint identification chip 120 can identify the fingerprint of the user. In addition, the fingerprint identification chip 120 is electrically connected to one of the pads 112 by reverse wire bonding. In contrast to the traditional wire bonding, while the molding layer 130 covers the fingerprint identification chip 120 and the wires W1, the method of reverse wire bonding can reduce the height of the wires W1. In other words, the height of the fingerprint module 100 can be reduced by reverse wire bonding.

Moreover, in the present embodiment, the materials of the molding layer 130, the color layer 140, and the protecting layer 150 are aluminum oxide. However, in other embodiment, the materials of the molding layer 130, the color layer 140, and the protecting layer 150 can be the oxides or the carbides of aluminum, titanium, chromium, and zirconium. For example, the materials of the molding layer 130, the color layer 140, and the protecting layer 150 can be selected form the group consisting of: aluminum oxide, titanium dioxide, titanium carbide, chromium oxide, chromium carbide, zirconium oxide, and zirconium carbide. Furthermore, the dielectric constants of the molding layer 130, the color layer 140, and the protecting layer 150 can be in the range of 15 to 45. However, the present invention is not limited thereto. In addition, the molding layer 130, the color layer 140, and the protecting layer 150 can sustain the high temperature in the range of 250 to 300° C. without deteriorating or having cracks on the surface.

In reality, after the package interconnection plate of the fingerprint identification chip 100' is cut, the fingerprint module 100 can be further electrically connected to the wiring board or other product, so as to identify the fingerprint. In the present embodiment, the fingerprint module 100 can be electrically connected to the wiring board by soldering. For example, plural solder balls are disposed on the bottom of the fingerprint module 100. The solder balls are heated, so as to immobilize the fingerprint module 100 on the wiring board.

It worth noting that, the soldering method have to rise the temperature up to 200° C. Since that the molding layer 130, the color layer 140, and the protecting layer 150 can sustain the high temperature in the range of 250 to 300° C., while the fingerprint module 100 is electrically connected to the substrate by soldering, the fingerprint module 100 would not deteriorate or crack on the surface.

Figure 2A:
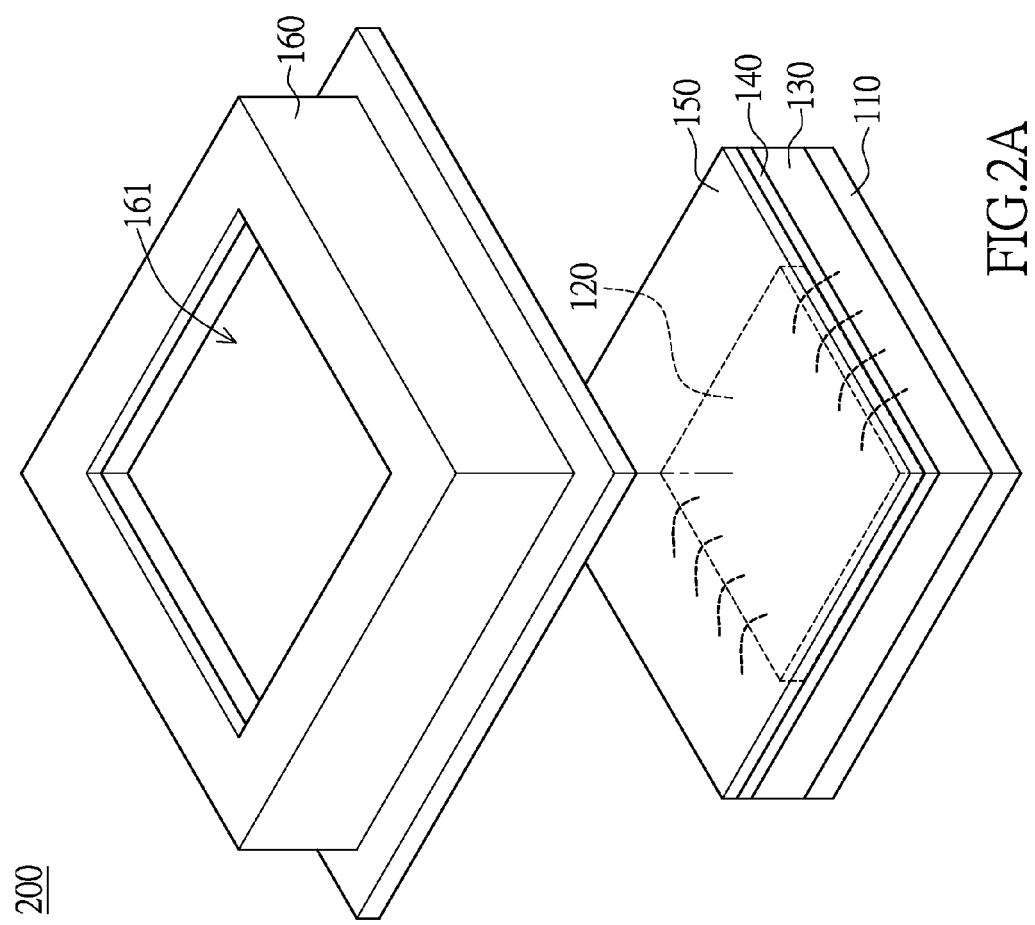
FIG. 2A is the perspective view of the fingerprint module in accordance with a second embodiment of the instant disclosure.
Figure 2B:
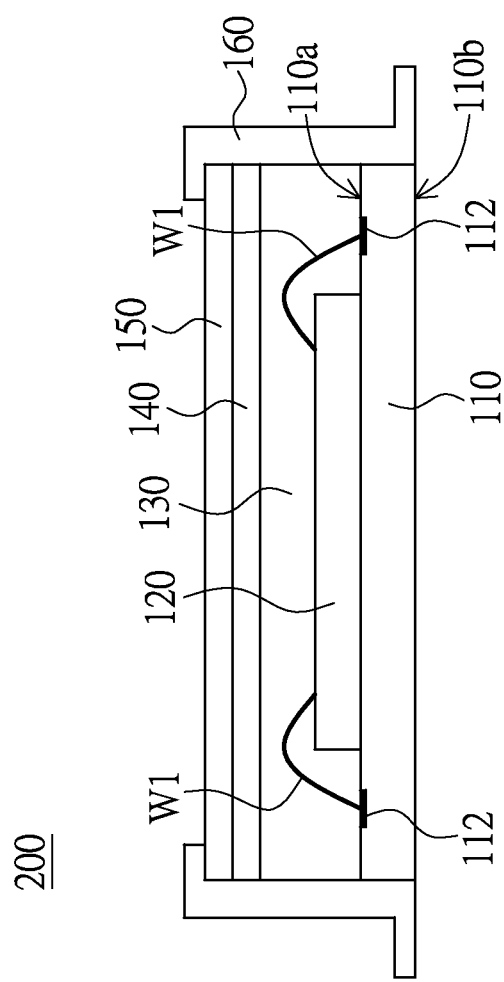
FIG. 2B is the cross-section view of the fingerprint module in accordance with the second embodiment of the instant disclosure.

FIG. 2A is the perspective view of the fingerprint module 200 in accordance with a second embodiment of the instant disclosure. FIG. 2B is the cross-section view of the fingerprint module 200 in accordance with the second embodiment of the instant disclosure. The fingerprint module 200 in the present embodiment is similar to the first embodiment. The fingerprint module 200 includes the substrate 110, the fingerprint identification chip 120, the molding layer 130, the color layer 140, and the protecting layer 150. The corresponding relation of the components is similar to the first embodiment, the description is omitted thereto.

However, different from the first embodiment, the fingerprint module 200 further comprises a protecting frame 160. Referring to FIGS. 2A and 2B, the protecting frame 160 is a hollow structure and further comprises an opening 161. In addition, the substrate 110, the fingerprint identification chip 120, the molding layer 130, the color layer 140 and the protecting layer 150 are disposed inside the opening 161, so as to form the fingerprint module 200. The arrangement and sequence of the substrate 110, the fingerprint identification chip 120, the molding layer 130, the color layer 140, and the protecting layer 150 are similar to the previous embodiment. The description is omitted thereto.

As shown in FIG. 2B, specifically, in the present embodiment, the top surface of the protecting layer 150 would abut to the top surface of the protecting frame 160. The surface 110b of the substrate 110 would locate at the same horizontal plane as the bottom of the protecting frame 160. In reality, while the fingerprint module 100 is electrically connected to the wiring board by soldering, since the bottom of the protecting frame 160 is at the same horizontal plane as the surface 110b, the soldering balls can also disposed on the bottom of the protecting frame 160, so as to enhance the disposed area of the soldering balls.

In addition, it worth noting that, while the finger or other object touches the fingerprint identification chip 120, the protecting frame 160 can bear part of the force applied by the finger or other object. In other words, the protecting frame 160 can enhance the structure strength of the fingerprint module 200. Furthermore, the protecting frame 160 can transmit the static electrostatic from finger or other object. In other words, the protecting frame 160 can protect the fingerprint identification chip 120 from the influence of the electrostatic.

Figure 3:
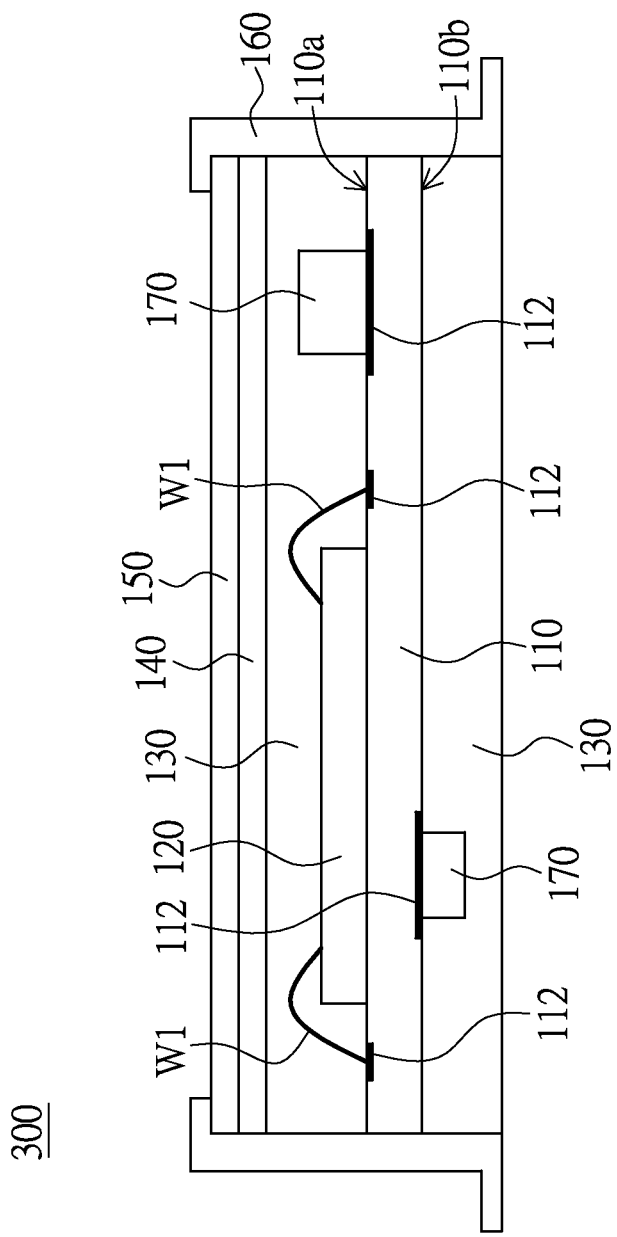
FIG. 3 is the perspective view of the fingerprint module in accordance with the third embodiment of the instant disclosure.

FIG. 3 is the perspective view of the fingerprint module 300 in accordance with the third embodiment of the instant disclosure. Referring to FIG. 3, similar to the fingerprint module 100 in accordance with the first embodiment, the fingerprint module 300 also includes the substrate 110, the fingerprint identification chip 120, the molding layer 130, the color layer 140, and the protecting layer 150. The corresponding relation of the components is similar to the previous embodiment, the description is omitted thereto.

However, different from the previous embodiment, the fingerprint module 300 further includes a plurality of the electronic components 170. As shown in FIG. 3, the electronic components 170 are disposed on the surface 110a and 110b of the substrate 110 and electrically connected to the substrate 110. Except for the fingerprint identification chip 120 and the wires W1, the electronic components 170 on the surface 110a are also embedded inside the molding layer 130. In addition, the fingerprint module 300 further includes another molding layer 130 covering the surface 110b and the electronic component 170 on the surface 110b.

Specifically, the whole fingerprint identification chip 120 and the electronic components 170 are embedded inside the molding layers 130, so that the molding layer 130 can protect the fingerprint identification chip 120 and the electronic components 170. In other words, the molding layer 130 can reduce the chance that the identification of the fingerprint identification chip 120 is in error according to the oil contamination from the finger touching and the powdery dirt from the external environment. In addition, the molding layer 130 can reduce the chance of the short circuit or the unnecessary electrically connection between the electronic components 170.

It worth noting that, the electronic components 170 can be the active components or the passive components. For example, the electronic components 170 can be the chip, transistor, diode, capacitor, inductor, other high-frequency component, or radio frequency component. Therefore, the fingerprint module 300 can have multiple applications and designs.

To sum up, the embodiment of the present invention provides the fingerprint module and the manufacturing method for the same. The fingerprint module includes the substrate, the fingerprint identification chip, the molding layer, the color layer, and the protecting layer. The molding layer, the color layer, and the protecting layer cover the fingerprint identification chip. The height from the top of the protecting layer to the fingerprint identification chip is only several tens of microns. The materials of the molding layer, the color layer, and the protecting layer are with high dielectric constant. In addition, the manufacturing method of the embodiment in the present invention includes electrically connected the fingerprint identification chip and the substrate by reversely bonding the wire, so as to reduce the height of the wire and the molding layer in need. While touching the protecting layer of the fingerprint module, the fingerprint identification chip can identify the fingerprint of the user. Moreover, the fingerprint identification chip can be protected.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A fingerprint module comprising:
a substrate comprising a pair of surfaces and a plurality of pads, the pair of surfaces formed on two sides of the substrate, the plurality of pads exposed on one of the pair of surfaces;
a fingerprint identification chip electrically connected with the substrate by at least a wire;
a molding layer disposed on the substrate and covering the fingerprint identification chip and the wire;
a color layer disposed on the molding layer; and
a protecting layer disposed on the color layer;
wherein the dielectric constants of the molding layer, the color layer, and the protecting layer are in the range of 15 to 45.

2. The fingerprint module of claim 1, wherein the fingerprint module further comprises a protecting frame disposed on the substrate; the protecting frame comprising an opening, the fingerprint identification chip are disposed inside the opening.

3. The fingerprint module of claim 1, wherein the materials of the molding layer, the color layer, and the protecting layer are selected form the group consisting of: aluminum oxide, titanium dioxide, titanium carbide, chromium oxide, chromium carbide, zirconium oxide, and zirconium carbide.

4. The fingerprint module of claim 1, wherein the shortest distant from the surface of the molding layer to the fingerprint identification chip is in the range of 25 to 50 μm.

5. The fingerprint module of claim 1, wherein the number of the molding layer is two, and the fingerprint module further comprise at least two electronic components, the electronic components deposited on the pair of surfaces individually, the molding layers covering the pair of surfaces and the electronic components.

6. A manufacturing of a fingerprint module comprising:
providing a substrate, the substrate comprising a pair of surfaces and a plurality of pads, the pair of surfaces disposed on two different sides of the substrate and the plurality of pads exposed on one of the pair of surfaces;
disposing a fingerprint identification chip on the substrate;
electrically connect at least one pad and the fingerprint identification chip by reversely bonding at least a wire;
forming a molding layer on the substrate after reversely bonding the wire, the molding layer covering the fingerprint identification chip and the wire;
grinding the molding layer after forming the molding layer;
forming a color layer on the molding layer after grinding the molding layer; and
forming a protecting layer on the color layer after forming the color layer.

7. The manufacturing method of claim 6, wherein a protecting frame is disposed on the substrate, the protecting frame comprises an opening, and the fingerprint identification chip is disposed inside the opening.

8. The manufacturing method of claim 6, wherein the materials of the molding layer, the color layer, and the protecting layer are selected form the group consisting of: aluminum oxide, titanium dioxide, titanium carbide, chromium oxide, chromium carbide, zirconium oxide, and zirconium carbide.

9. The manufacturing method of claim 8, wherein the dielectric constants of the molding layer, the color layer, and the protecting layer are in the range of 15 to 45.

10. The manufacturing method of claim 6, wherein the shortest distant from the surface of the molding layer to the fingerprint identification chip is in the range of 25 to 50 μm.

11. The manufacturing method of claim 6, wherein before forming the molding layer, the manufacturing method further comprises forming at least two electronic components disposed on the pair of surfaces individually,
wherein the number of the molding layer is two, the molding layers cover the pair of surfaces and the electronic components individually.

12. A fingerprint module comprising:
a substrate comprising a pair of surfaces and a plurality of pads, the pair of surfaces formed on two sides of the substrate, the plurality of pads exposed on one of the pair of surfaces;
a fingerprint identification chip electrically connected with the substrate by at least a wire;
a molding layer disposed on the substrate and covering the fingerprint identification chip and the wire;

a color layer disposed on the molding layer; and
a protecting layer disposed on the color layer;
wherein the shortest distant from the surface of the molding layer to the fingerprint identification chip is in the range of 25 to 50 μm.

* * * * *